United States Patent
Beaulaton et al.

(10) Patent No.: US 9,116,562 B2
(45) Date of Patent: Aug. 25, 2015

(54) DIGITAL SAMPLE CLOCK GENERATOR, A VIBRATION GYROSCOPE CIRCUITRY COMPRISING SUCH DIGITAL SAMPLE CLOCK GENERATOR, AN ASSOCIATED APPARATUS, AN ASSOCIATED SEMICONDUCTOR DEVICE AND ASSOCIATED METHODS

(75) Inventors: Hugues Beaulaton, Toulouse (FR); Sung-Jin Jo, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/409,350

(22) PCT Filed: Jul. 4, 2012

(86) PCT No.: PCT/IB2012/001449
§ 371 (c)(1),
(2), (4) Date: Dec. 18, 2014

(87) PCT Pub. No.: WO2014/006437
PCT Pub. Date: Jan. 9, 2014

(65) Prior Publication Data
US 2015/0177775 A1    Jun. 25, 2015

(51) Int. Cl.
| | | |
|---|---|---|
| *H05B 37/00* | (2006.01) | |
| *H05B 39/00* | (2006.01) | |
| *G06F 1/04* | (2006.01) | |
| *G01C 19/5776* | (2012.01) | |
| *G01D 5/243* | (2006.01) | |
| *G01D 5/14* | (2006.01) | |
| *H03K 21/00* | (2006.01) | |

(52) U.S. Cl.
CPC .............. *G06F 1/04* (2013.01); *G01C 19/5776* (2013.01); *G01D 5/14* (2013.01); *G01D 5/243* (2013.01); *H03K 21/00* (2013.01)

(58) Field of Classification Search
USPC .......................... 327/147–149, 156–158, 160
See application file for complete search history.

(56) References Cited

U.S. PATENT DOCUMENTS

| | | | |
|---|---|---|---|
| 7,665,360 | B2 | 2/2010 | Kurihara |
| 2004/0158759 | A1 | 8/2004 | Chang et al. |
| 2005/0081076 | A1 | 4/2005 | Okuda |
| 2008/0018374 | A1 | 1/2008 | Fujii |
| 2011/0102258 | A1* | 5/2011 | Underbrink et al. ..... 342/357.47 |
| 2011/0197674 | A1 | 8/2011 | Prandi et al. |
| 2011/0199154 | A1* | 8/2011 | Pu et al. ........................ 327/543 |
| 2012/0022779 | A1* | 1/2012 | Lee ................................ 701/207 |
| 2013/0099836 | A1* | 4/2013 | Shaeffer et al. ............... 327/148 |
| 2014/0218082 | A1* | 8/2014 | Fan ................................ 327/157 |
| 2014/0251009 | A1* | 9/2014 | Schlarmann et al. ....... 73/504.12 |
| 2014/0260713 | A1* | 9/2014 | Shaeffer et al. .................. 74/5.4 |
| 2014/0269813 | A1* | 9/2014 | Lee et al. .......................... 374/1 |
| 2014/0305207 | A1* | 10/2014 | Entringer et al. .......... 73/504.12 |

FOREIGN PATENT DOCUMENTS

| | | |
|---|---|---|
| GB | 2424706 A | 10/2006 |
| JP | 2006153715 A | 6/2006 |
| WO | 97-36370 A | 10/1997 |

OTHER PUBLICATIONS

International Search Report and Written Opinion correlating to PCT/IB2012/001449 dated Mar. 29, 2013.

* cited by examiner

*Primary Examiner* — Adam Houston

(57) ABSTRACT

A digital sample clock generator for generating a sample clock signal from an input signal derived from a drive measurement voltage signal of a vibrating MEMS gyroscope is provided.

20 Claims, 8 Drawing Sheets

US 9,116,562 B2

DIGITAL SAMPLE CLOCK GENERATOR, A VIBRATION GYROSCOPE CIRCUITRY COMPRISING SUCH DIGITAL SAMPLE CLOCK GENERATOR, AN ASSOCIATED APPARATUS, AN ASSOCIATED SEMICONDUCTOR DEVICE AND ASSOCIATED METHODS

FIELD OF THE INVENTION

This invention relates to a digital sample clock generator, a vibration gyroscope circuitry comprising such digital sample clock generator, an associated apparatus, an associated semiconductor device and associated methods.

BACKGROUND OF THE INVENTION

Vibrating micro-electro-mechanical-system (MEMS) gyroscopes are used in a variety of systems where an angular rotation rate is to be measured. A vibrating MEMS gyroscope hereto comprises a gyroscope mass that is connected by springs to a substrate. The gyroscope mass is movable along a driving axis in resonant oscillation by the use of a drive force to provoke and maintain the movement. The drive force is supplied and controlled using a drive actuation unit and a drive measurement unit and associated circuitry. The drive actuation unit comprises, e.g., a capacitive coupling along the driving axis between a capacitor plate on the substrate and an opposite capacitor plate on the movable gyroscope mass. A force acting on the gyroscope mass may be induced as a capacitive force by applying a voltage to the capacitor plates of the drive actuation unit, whereby the gyroscope mass is moved. The drive measurement unit comprises, e.g., a similar pair of capacitor plates. The capacitance between the capacitor plates of the drive measurement unit is measured as a drive measurement signal and forms an indication of the replacement of the gyroscope mass along the driving axis. A Coriolis force will apply to the gyroscope mass in the presence of an angular rotation. The Coriolis force is proportional to the velocity of the gyroscope mass, its angular rate of rotation and its mass, and perpendicular to the direction of movement. The Coriolis force hereby results in a replacement of the gyroscope mass along a sensing axis perpendicular to the driving axis. Measurement of the replacement of the gyroscope mass along the sensing axis can be used to obtain a measure of the Coriolis force and thus a measure of the angular rate of rotation. Hereto, a sense measurement unit is provided which, similar to the drive measurement unit, may comprise a capacitive coupling along the sensing axis between a sense capacitor plate on the substrate and an opposite sense capacitor plate on the movable gyroscope mass. The capacitance between the sense capacitor plates of the sense measurement unit is measured as a sense measurement signal and forms an indication of the replacement of the gyroscope mass along the sensing axis.

Determination of the angular rotation rate requires a consistent movement of the gyroscope mass along the driving axis. Hereto, the vibrating MEMS gyroscope comprises a drive-mode circuitry to measure and control the amplitude of the, sinusoidal, movement of the gyroscope mass. In a vibrating MEMS gyroscope, measuring and controlling may be performed by determining a difference between a reference amplitude and the amplitude of the movement and controlling a gain of a drive actuation signal to control the drive actuation unit to supply the voltage to the capacitor plates of the drive actuation unit in accordance with the gain. In known vibrating MEMS gyroscopes, the amplitude of the movement may be measured by sampling the drive measurement signal once every period at extremes of the drive measurement signal by the use of a phase-locked loop (PLL) to determine an in-phase clock with an appropriate phase relative to the drive measurement signal from drive measurement signal to coincide with the extremes of the drive measurement signal. The PLL may thus maintain the appropriate phase also when the period of the drive measurement signal is changing, e.g., due to a change of the oscillation period of the gyroscope mass due to, e.g., environmental conditions such as temperature.

Determination of the angular rotation rate is performed by determining a measure of the amplitude and relative phase of the, sinusoidal, replacement of the gyroscope mass along the sensing axis, the relative phase being measured relative to the replacement of the gyroscope mass along the driving axis. Hereto, the vibrating MEMS gyroscope comprises a sense-mode circuitry to sample the sense measurement signal with a phase relation with the drive measurement signal using an in-phase clock to obtain in-phase sense-measurement samples and to sample the sense measurement signal at a quadrature phase relative to the drive measurement signal using a quadrature clock to obtain quadrature sense-measurement samples associated with a, so-called, quadrature signal between the sense measurement signal and the drive measurement signal. Combining the in-phase sense-measurement samples and the quadrature sense-measurement samples then allows to determine the amplitude of the displacement along the sensing axis, and thereby a measure of the angular rotation rate and a measure of an amplitude of the quadrature signal. In known vibrating MEMS gyroscopes, a phase-locked loop (PLL) is used to establish the in-phase clock from the drive measurement signal and, on some known vibrating MEMS gyroscopes, another phase-locked loop (PLL) is used to establish the quadrature clock from the drive measurement signal.

SUMMARY OF THE INVENTION

The present invention provides a digital sample clock generator, a vibration gyroscope circuitry comprising such digital sample clock generator, an associated apparatus, an associated semiconductor device and associated methods as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
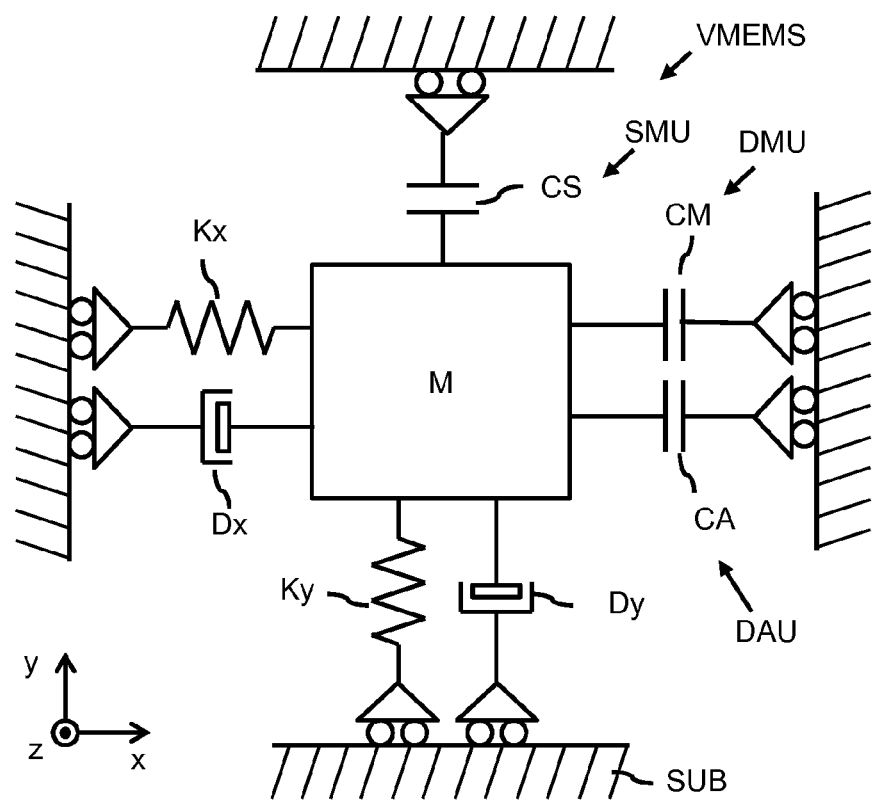
FIG. 1 schematically shows an example of vibration MEMS gyroscope.

FIG. 1 schematically shows an example of vibration MEMS gyroscope VMEMS. The vibrating MEMS gyroscope VMEMS has a gyroscope mass M that is connected by springs, indicated with respective spring coefficients Kx, Ky, to a substrate SUB. FIG. 1 further schematically indicates pistons Dx and Dy indicating a modelling of damping behaviour of the springs and friction, such as air friction, of movement of the gyroscope mass M. The gyroscope mass M is movable along a driving axis x using a drive force. The drive force is supplied and controlled using a drive actuation unit DAU and a drive measurement unit DMU and associated circuitry (exemplary circuitry is shown and described below). The drive actuation unit DAU comprises a drive capacitor CA having a drive capacitor plate connected to the substrate SUB and an opposite drive capacitor plate connected to the movable gyroscope mass M. The opposite drive capacitor plate may be formed by a part of the movable mass M. The drive capacitor CA of the drive actuation unit DAU is oriented such that a capacitive force between the drive capacitor plate and the opposite drive capacitor plate is oriented along the drive axis x for providing the drive force to displace the gyroscope mass M.

The drive measurement unit DMU comprises a measurement capacitor CM having a measurement capacitor plate connected to the substrate SUB and an opposite measurement capacitor plate connected to the movable gyroscope mass M. The opposite measurement capacitor plate may be formed by a part of the movable mass M. The measurement capacitor CM of the drive measurement unit DMU is oriented such that a capacitive force between the measurement capacitor plate and the opposite measurement capacitor plate is oriented along the drive axis x. A measure of the capacitive force between the measurement capacitor plate and the opposite measurement capacitor may thus provide a measure of the displacement of the gyroscope mass M along the drive axis.

The sense measurement unit SMU comprises a sense capacitor CS having a sense capacitor plate connected to the substrate SUB and an opposite sense capacitor plate connected to the movable gyroscope mass M. The opposite sense capacitor plate may be formed by a part of the movable mass M. The sense capacitor CS of the sense measurement unit SMU is oriented such that a capacitive force between the sense capacitor plate and the opposite sense capacitor plate is oriented along a sense axis y, the sense axis y being perpendicular to the drive axis x.

Figure 2:
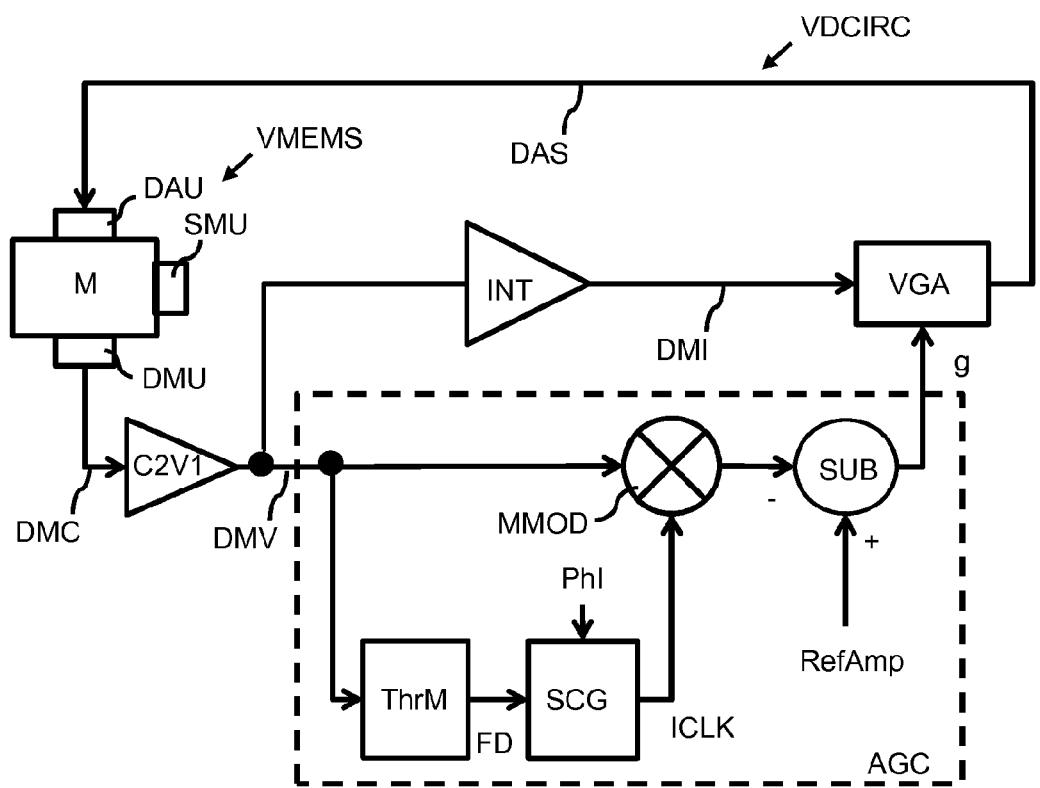
FIG. 2 schematically shows an example of an embodiment of a drive-mode vibration gyroscope circuitry arranged to drive a vibration MEMS gyroscope.

FIG. 2 schematically shows an example of an embodiment of a drive-mode vibration gyroscope circuitry VDCIRC arranged to drive a vibration MEMS gyroscope VMEMS. The vibration MEMS gyroscope VMEMS corresponds to the vibration MEMS gyroscope VMEMS shown in FIG. 1. However, the drive-mode vibration circuitry VDCIRC may also be suitable and used together with other types of vibration MEMS gyroscopes.

The drive-mode vibration gyroscope circuitry VDCIRC comprises a first capacitance-to-voltage unit C2V1, an automatic gain circuit AGC, an integrator INT and a variable gain amplifier VGA.

The first capacitance-to-voltage unit C2V1 is connected to the measurement capacitor CM of the drive measurement unit DMU and is arranged to provide a measure of the capacitance between the capacitor plates of the measurement capacitor CM as a drive measurement voltage signal DMV. Hereby, the first capacitance-to-voltage unit C2V1 is arranged to provide a drive measurement voltage signal DMV indicative of a displacement of a gyroscope mass M along a drive axis x of a vibrating MEMS gyroscope VMEMS.

The variable gain amplifier VGA is connected to the drive capacitor CA of the drive actuation unit DAU to provide a drive voltage signal DAS to the drive capacitor CA, resulting in a capacitive force between the capacitor plates of the drive capacitor CA, oriented along the driving axis, and thereby invoke and maintain the movement of the gyroscope mass M along the driving axis x.

The integrator INT is arranged to integrate the drive measurement voltage signal DMV to obtain an integrated drive measurement voltage signal DMI. The integrator effectively shifts the phase of the drive measurement voltage signal DMV by 90 degrees to compensate for the phase lag of the vibrating MEMS between drive signal and drive measurement signal.

The automatic gain circuit AGC is arranged to receive the drive measurement voltage signal DMV, to determine a gain factor g in dependence on a pre-determined reference envelope amplitude RefAmp and the provide the gain factor g to the variable gain amplifier VGA. Hereby, the drive-mode vibration gyroscope circuitry VDCIRC may control the vibration MEMS gyroscope VMEMS to oscillate with a pre-determined amplitude corresponding to the pre-determined reference envelope amplitude RefAmp. The automatic gain circuit AGC comprises a threshold detector ThrM, a digital sample clock generator SCG, a drive measurement signal sampler MMOD, and a subtractor SUB. The threshold detector ThrM is arranged to perform a threshold detection on the drive measurement voltage signal DMV to obtain a digital signal FD. The threshold detection uses a threshold value corresponding to the zero level of the drive measurement voltage signal DMV, such that sign changes of the drive measurement voltage signal DMV are reflected in the digital signal FD. The digital sample clock generator SCG is arranged to receive the digital signal FD as an input signal and to generate a sample clock ICLK in dependence on a pre-determined in-phase phase shift fraction PhI as an in-phase sample clock ICLK so as to obtain the in-phase sample clock in-phase with the drive measurement voltage signal DMV. The in-phase sample clock is thus arranged to match extremes in the drive measurement voltage signal DMV, allowing to effectively sample the envelope of the drive measurement voltage signal DMV using the in-phase sample clock. The drive measurement signal sampler MMOD is arranged to receive the drive measurement voltage signal DMV and the in-phase sample clock ICLK, and to sample the drive measurement voltage signal DMV with the in-phase sample clock ICLK to obtain envelope sample values. The drive measurement signal sampler MMOD thus obtains a measure of an envelope of the drive measurement voltage signal DMV. The subtractor SUB is arranged to receive envelope sample values and the pre-determined reference envelope amplitude RefAmp, and to the subtract the envelope sample values from the pre-determined reference envelope amplitude RefAmp to obtain the gain factor g.

The drive-mode vibration gyroscope circuitry VDCIRC, and more specifically the digital sample clock generator SCG, thus generates an in-phase sample clock ICLK without using a PLL. Hereby, at least some of the disadvantages associated with using a PLL are alleviated, such as the PPL's need for external components and an external pin associated with a loop filter of the PLL, a settling time of the PLL, a semiconductor device area required for a PLL and/or power consumption of a PLL.

The pre-determined reference envelope amplitude RefAmp and/or the pre-determined in-phase phase shift fraction PhI may be pre-stored in a non-volatile memory (not shown) of the drive-mode vibration gyroscope circuitry VDCIRC, e.g., be programmed during the manufacturing by a user. The non-volatile memory may be integrated with the drive-mode vibration gyroscope circuitry VDCIRC or provided as a separate memory device. The pre-determined reference envelope amplitude RefAmp and/or pre-determined in-phase phase shift fraction PhI may be provided, during use of the drive-mode vibration gyroscope circuitry VDCIRC, by a user, such as a controller arranged to operate and control the drive-mode vibration gyroscope circuitry VDCIRC.

Figure 3A:
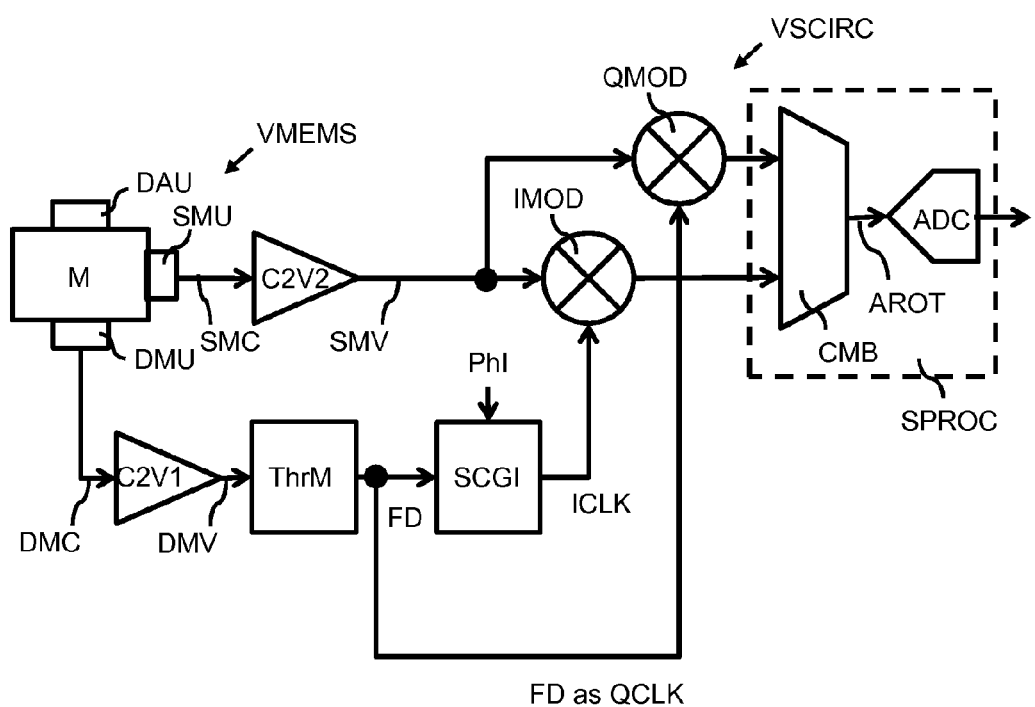
FIG. 3a, FIG. 3b and FIG. 3c schematically show examples of embodiments of a sense-mode vibration gyroscope circuitry arranged to process a sense measurement signal of a vibration MEMS gyroscope.

FIG. 3a schematically show an example of a first embodiment of a sense-mode vibration gyroscope circuitry VSCIRC arranged to process a sense measurement signal of a vibration MEMS gyroscope VMEMS.

The sense-mode vibration gyroscope circuitry VSCIRC comprises a first capacitance-to-voltage unit C2V1, a threshold detector ThrM and a digital sample clock generator SCG1. The same reference symbols are used for the first capacitance-to-voltage unit C2V1 and the threshold detector ThrM of FIG. 3a as for FIG. 2, as these units may be corresponding units. In embodiments comprising a sense-mode vibration gyroscope circuitry VSCIRC as well as a drive-mode vibration gyroscope circuitry VDCIRC, these units may be shared or may be provided separately for the sense-mode vibration gyroscope circuitry VSCIRC and the drive-mode vibration gyroscope circuitry VDCIRC.

Similar as in FIG. 2, the first capacitance-to-voltage unit C2V1 is connected to the measurement capacitor CM of the drive measurement unit DMU and is arranged to provide a measure of the capacitance between the capacitor plates of the measurement capacitor CM as a drive measurement voltage signal DMV. Hereby, the first capacitance-to-voltage unit C2V1 is arranged to provide a drive measurement voltage signal DMV indicative of a displacement of a gyroscope mass M along a drive axis x of a vibrating MEMS gyroscope VMEMS.

The threshold detector ThrM is arranged to perform a threshold detection on the drive measurement voltage signal DMV to obtain a digital signal FD. The threshold detection uses a threshold value corresponding to the zero level of the drive measurement voltage signal DMV, such that sign changes of the drive measurement voltage signal DMV are reflected in the digital signal FD.

The digital sample clock generator SCG1 is arranged to receive the digital signal FD as an input signal and to generate a sample clock ICLK in dependence on a pre-determined in-phase phase shift fraction PhI as an in-phase sample clock ICLK so as to obtain the in-phase sample clock in-phase with the drive measurement voltage signal DMV. The in-phase sample clock is thus arranged to match extremes in the replacements of the gyroscope mass M.

The sense-mode vibration gyroscope circuitry VSCIRC further comprises a second capacitance-to-voltage unit C2V2, a first sampler IMOD, a second sampler QMOD and a sample processor SPROC.

The second capacitance-to-voltage unit C2V2 is connected to the sense capacitor CS of the sense measurement unit SMU and is arranged to provide a measure of the capacitance between the capacitor plates of the sense capacitor CS as a sense measurement voltage signal SMV. Hereby, the second capacitance-to-voltage unit C2V2 is arranged to provide a sense measurement voltage signal SMV indicative of a displacement of the gyroscope mass M along a sense axis y, the sense axis x being at a sense angle relative to the drive axis x. Such displacement may be associated with the Coriolis force induced by an angular rotation rate.

The first sampler IMOD is connected to the digital sample clock generator SCG1 to receive the in-phase sample clock ICLK from the digital sample clock generator SCG1. The first sampler IMOD is connected to the second capacitance-to-voltage unit C2V2 to receive the sense measurement voltage signal SMV from the second capacitance-to-voltage unit C2V2. The first sampler IMOD is arranged to sample the sense measurement voltage signal SMV with the in-phase sample clock ICLK to obtain in-phase sense sample values.

The second sampler QMOD is connected to the threshold detector ThrM and arranged to receive the digital signal FD as a quadrature sample clock QCLK from the threshold detector ThrM. The second sampler QMOD is connected to the second capacitance-to-voltage unit C2V2 to receive the sense measurement voltage signal SMV from the second capacitance-to-voltage unit C2V2. The second sampler QMOD is arranged to sample the sense measurement voltage signal SMV with the quadrature sample clock QCLK to obtain quadrature sense sample values.

The sample processor SPROC is connected to the first sampler IMOD to receive the in-phase sense sample values from the first sampler IMOD and connected to the second sampler QMOD to receive the quadrature sense sample values from the second sampler QMOD. The sample processor SPROC is arranged to process the in-phase sense sample values and the quadrature sense sample values to derive a suitable measure therefrom. The sample processor SPROC may e.g. be arranged to determine a measure AROT of an angular rate in dependence on at least the in-phase sense samples and to output the measure AROT to another unit (not shown) in analogue or digital form. The determining as such of the measure AROT is known to the skilled person and is not described in further detail here. The sample processor SPROC may be arranged to determine additional measures from the in-phase sense samples and/or the quadrature sense sample values. The sample processor SPROC may be arranged to provide the in-phase sense samples and/or the quadrature sense sample values to the another unit for further processing by the another unit of the in-phase sense samples and/or the quadrature sense sample values.

In the example shown in FIG. 3a, the sample processor SPROC hereto comprises a sample combiner CMB and an analogue to digital convertor ADC. The sample combiner CMB is connected to the first sampler IMOD to receive the in-phase sense sample values from the first sampler IMOD and connected to the second sampler QMOD to receive the quadrature sense sample values from the second sampler QMOD. The sample combiner CMB is arranged to determine a measure AROT of an angular rate in dependence on the in-phase sense sample values and the quadrature sense sample values. The determining as such of the measure AROT from in-phase and quadrature sense sample values is known to the skilled person and is not described in further detail here.

The measure AROT may be an analogue measure and the sense-mode vibration gyroscope circuitry VSCIRC may further comprise an analogue to digital convertor ADC to convert the analogue measure into a digital value.

The sample processor SPROC may comprise, or cooperate with, further circuitry arranged to receive the in-phase sense sample values and/or the quadrature sense sample values to determine a measure of a miss-quadrature between sense and drive channels and to perform quadrature compensation. The determining as such of such measure of miss-quadrature and quadrature compensation are known to the skilled person and are not described in further detail here.

Figure 3B:
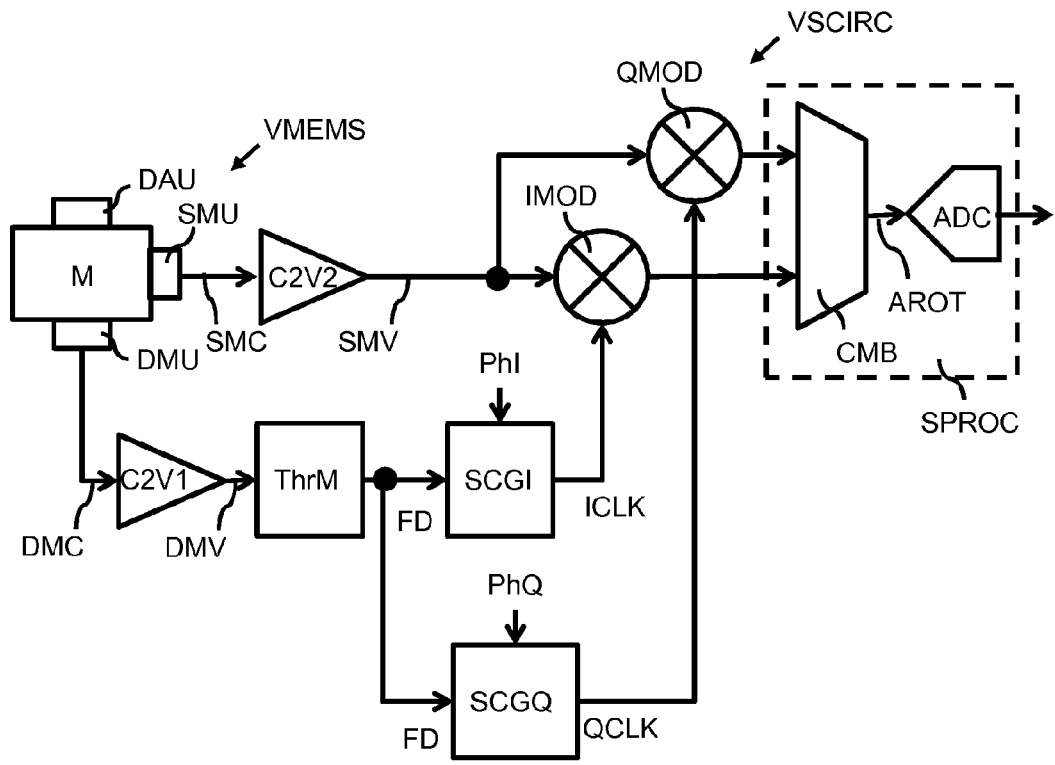

FIG. 3b schematically show an example of a second embodiment of a sense-mode vibration gyroscope circuitry VSCIRC arranged to process a sense measurement signal of a vibration MEMS gyroscope VMEMS.

The example shown in FIG. 3b differs from that shown in FIG. 3a in that the sense-mode vibration gyroscope circuitry VSCIRC of FIG. 3b further comprises a further digital sample clock generator SCGQ. The further digital sample clock generator SCGQ is connected to the threshold detector ThrM and arranged to receive the digital signal FD as input signal from the threshold detector ThrM. The example further differs in that the second sampler QMOD is connected to the further digital sample clock generator SCGQ to receive the quadrature sample clock QCLK from the further digital sample clock generator SCGQ, and not directly from the threshold detector ThrM. The further digital sample clock generator SCGQ is arranged to receive the digital signal FD as input signal and to generate a sample clock as the quadrature sample clock QCLK in dependence on a pre-determined quadrature phase shift fraction PhQ, the quadrature sample clock QCLK having a pre-determined quadrature phase shift relative to the drive measurement voltage signal DMV.

The pre-determined in-phase phase shift fraction PhI and/or the pre-determined quadrature phase shift fraction PhQ of FIG. 3a and FIG. 3b may be pre-stored in a non-volatile memory (not shown) of the sense-mode vibration gyroscope circuitry VSCIRC, e.g., be programmed during the manufacturing by a user. The non-volatile memory may be integrated with the sense-mode vibration gyroscope circuitry VSCIRC or provided as a separate memory device. The pre-determined in-phase phase shift fraction PhI and/or the pre-determined quadrature phase shift fraction PhQ may be provided, during use of the sense-mode vibration gyroscope circuitry VSCIRC, by a user, such as a controller arranged to operate and control the sense-mode vibration gyroscope circuitry VSCIRC.

Figure 3C:
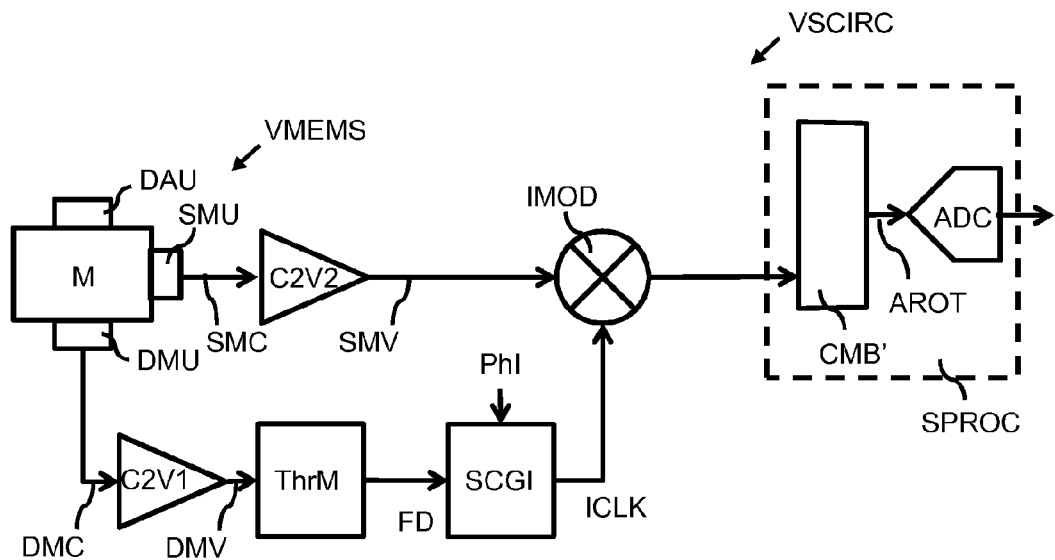

FIG. 3c schematically show an example of a third embodiment of a sense-mode vibration gyroscope circuitry VSCIRC arranged to process a sense measurement signal of a vibration MEMS gyroscope VMEMS.

The example shown in FIG. 3c differs from that shown in FIG. 3a and FIG. 3b in that the sense-mode vibration gyroscope circuitry VSCIRC of FIG. 3c does not have a second sampler QMOD for obtaining quadrature sense sample values. Also, the exemplary sense-mode vibration gyroscope circuitry VSCIRC shown in FIG. 3c does not comprise circuitry for generating the quadrature sample clock QCLK. Further, the sample combiner CMB of FIG. 3a and FIG. 3b is replaced by an alternative sample combiner CMB'.

The sense-mode vibration gyroscope circuitry VSCIRC shown in FIG. 3c may e.g. be used where the quadrature component may be neglected for systems where the vibrating MEMS gyroscope VMEMS has a very low quadrature error. For these systems, the angular rate may be determined with a sufficient accuracy without using quadrature sense sample values. Hereto, the sample combiner CMB' of the sense-mode vibration gyroscope circuitry VSCIRC is arranged to determine a measure AROT of an angular rate in dependence on the in-phase sense sample values.

Figure 4:
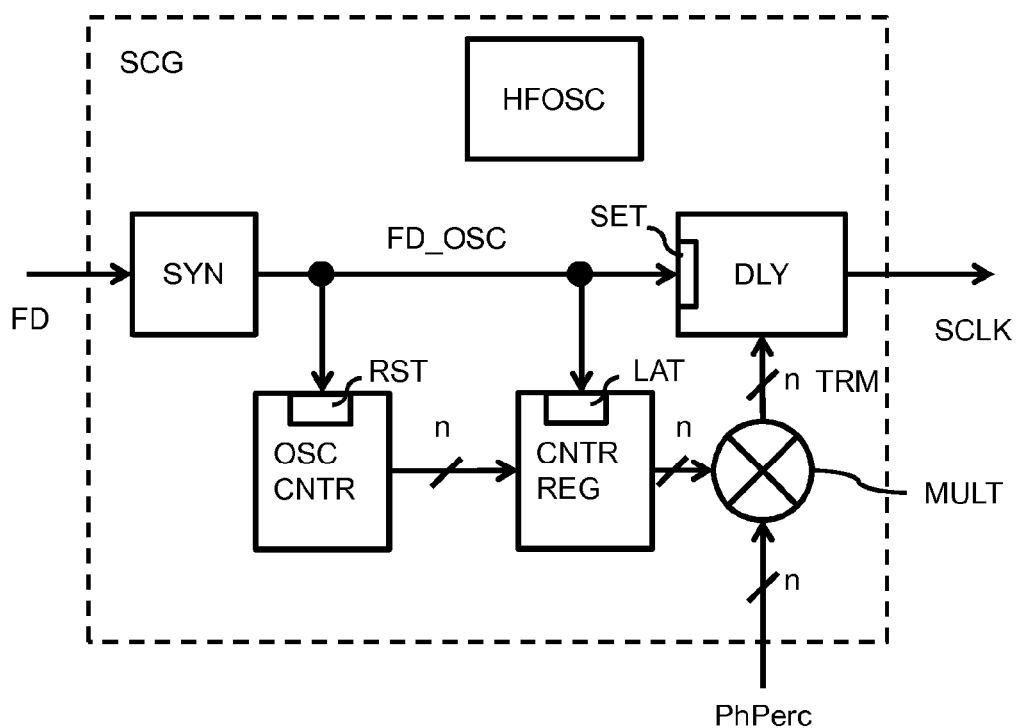
FIG. 4 schematically shows an example of an embodiment of a sample clock generator for use in a vibration gyroscope circuitry.

FIG. 4 schematically shows an example of an embodiment of a sample clock generator SCG for use in a vibration gyroscope circuitry. The sample clock generator SCG of FIG. 2, the sample clock generators SCGI of FIG. 3a and FIG. 3b, and the sample clock generator SCGQ of FIG. 3b may correspond to instantiations of this embodiment.

Figure 5:
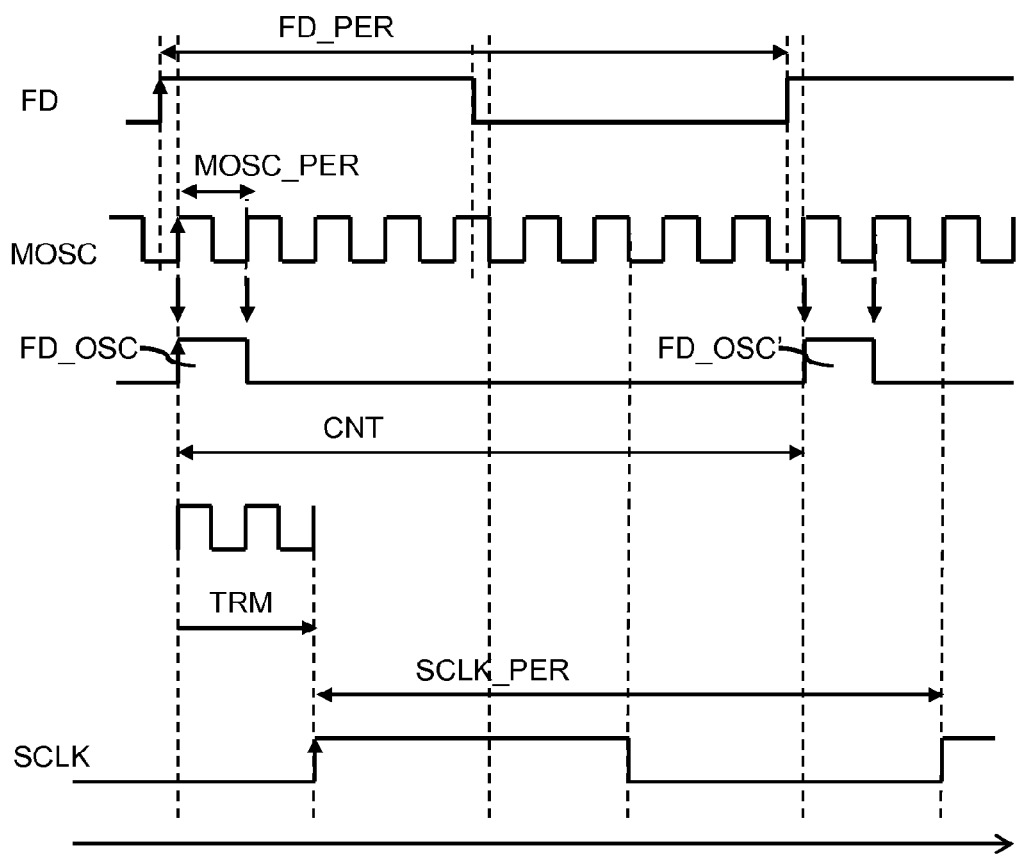
FIG. 5 schematically indicates an example of an operation of the example of FIG. 4.

The operation of the sample clock generator SCG for use in a vibration gyroscope circuitry of FIG. 4 will be described with reference to schematical, simplified, exemplary signals FD, MOSC, FD_OSC, FD_OSC', SCLK shown in FIG. 5 with time t progressing from left to right.

The sample clock generator SCG shown in FIG. 4 is arranged to generate a sample clock signal SCLK from an input signal FD. The sample clock generator SCG comprises an oscillator HFOSC, a synchronization unit SYN, a count register CNTRREG, a multiplier MULT and a delay unit DLY. The input signal is a signal derived from a drive measurement voltage signal (DMV) of a vibrating MEMS gyroscope (VMEMS), and may correspond to the digital signal FD described with reference to FIG. 2, FIG. 3a or FIG. 3b. The oscillator HFOSC is arranged to generate a master clock MOSC with a master clock period MOSC_PER, as indicate in FIG. 5. It will be appreciated that the master clock MOSC has been drawn at a lower master clock frequency than is actually used in order not to obscure the figure.

The synchronization unit SYN is arranged to receive the input signal FD. The synchronization unit SYN is arranged to generate a synchronization pulse FD_OSC from the input signal FD. Hereto, the synchronization unit is arranged to detect a start of an input signal period FD_PER of the input signal FD and to, upon detecting the start, generate a synchronization pulse FD_OSC in synchronization with the master clock MOSC. As an example, FIG. 5 shows that, at a rising edge of the indicated master clock period MOSC_PER, the input signal FD has changed from input signal level '0' to input signal level '1', corresponding to the start of an input signal period FD_PER of the input signal FD. The synchronization unit SYN detects the input signal level to have changed from '0' to '1', and, upon detecting such change so as to detect the start of an input signal period FD_PER, generates a synchronization pulse FD_OSC in synchronization with the master clock MOSC and having a length of, in this example, one master clock period MOSC_PER. A subsequent synchronization pulse FD_OSC' is generated after a next change of input signal level '0' to input signal level '1' is detected, corresponding to the start of a subsequent input signal period of the input signal FD. Hereby, the synchronization unit SYN that effectively generates a synchronization pulse FD_OSC that is synchronized to the master clock from the asynchronous input signal FD, and that has a synchronized period in between subsequent synchronization pulses FD_OSC, FD_OSC' as an integer multiple of the master clock. It will be appreciated that, in an alternative example, changes from '1' to '0' may be detected and used to generate the synchronization pulse.

The counter unit OSCCNTR is arranged to count master clock periods between subsequent synchronization pulses FD_OSC, FD_OSC' to obtain the number of master clock periods between subsequent synchronization pulses as a number count. The number count is indicated in FIG. 5 with reference symbol CNT. The number count thus expresses the length of a period between subsequent synchronization pulses FD_OSC and FD_OSC' in master clock periods MOSC_PER.

The counter unit OSCCNTR is arranged to provide the number count, while counting, to the count register CNTRREG. The count register CNTRREG is arranged to store the number count. The count register comprises a latch input for receiving the synchronization pulse FD_OSC for latching the number count as stored in the count register to the multiplier MULT upon receiving the synchronization pulse FD_OSC. The number count is provides as an n-bit number, as indicated by the n next to the signal line connecting the counter unit OSCCNTR to the count register CNTRREG. The number of bits n may for example be in a range of 5-12 to reflect a ratio between the period of the input signal and the master clock period of, e.g. 20-2000 times, but may alternatively a larger number.

The counter unit OSCCNTR may further comprise a reset input for receiving the synchronization pulse FD_OSC, the counter unit being arranged to reset a counter upon receiving the synchronization pulse FD_OSC. The counter unit OSC-CNTR may be arranged to increment the counter at each master clock period and to store the counter in the count register CNTRREG. The counter unit OSCCNTR may thus be arranged to initialize the counter in synchronization with each synchronization pulse and increment the counter at each subsequent master clock period to count the number of master clock periods and let the count register CNTRREG store the number of master clock periods as thus counted, while the count register CNTRREG will latch the number at a subsequent synchronization pulse to provide the number count representing the number of master clock periods between the synchronization pulse FD_OSC and the subsequent synchronization pulse FD_OSC'.

The multiplier MULT is arranged to establish a pre-determined phase shift fraction PhPerc. The pre-determined phase shift fraction PhPerc may be provided as a percentage, or in any other suitable form that allows the multiplier to convert it into a fraction. The multiplier MULT may, e.g., retrieve the pre-determined phase shift fraction PhPerc from a non-volatile memory, or receive the pre-determined phase shift fraction PhPerc from a user, such as a controller arranged to operate and control the drive-mode or sense-mode vibration gyroscope circuitry VDCIRC or VSCIRC that comprises the sample clock generator SCG. The multiplier MULT is arranged to multiply the number count of master clock periods with a pre-determined phase shift fraction PhPerc to obtain a number of trim periods TRM. The number of trim periods TRM hereby substantially corresponds to the pre-determined phase shift fraction in master clock period units.

The delay unit DLY is arranged to receive the synchronization pulse FD_OSC from the synchronization unit SYN and to receive the number of trim periods TRM from the multiplier. The delay unit DLY is arranged to generate the sample clock signal SLCK with a clock signal period SCLK_PER corresponding to the number count CNT and with a delay relative to the synchronization pulse FD_OSC corresponding to the number of trim periods TRM. The delay is indicated with arrow labelled TRM in FIG. 5. If the input period FD_PER of the input signal FD varies more than one master clock period, the number counter (i.e., the number of master clock periods in the input period FP_PER as counted by the counter unit OSCCNTR) will vary, the number of TRM periods will be adjusted proportionally, while the sample clock signal SCLK substantially maintains its phase relation with the input signal FD. The delay unit DLY may hereto comprise a delay counter arranged to, upon receiving the synchronization pulse FD_OSC, count a number of master clock periods corresponding to the number of trim periods TRM, and, after this number of master clock periods has lapsed, generate a period of the sample clock signal from first outputting the sample clock signal SCLK at a sample clock signal level corresponding to a first logical level, for example '1', during a number of master clock periods corresponding to half of the number count (the number count corresponding to the number of master clock periods between subsequent synchronization pulses) and subsequently outputting the sample clock signal SCLK at a sample clock signal level corresponding to a, different, second logical level, for example '0', during a number of master clock periods corresponding to half of the number count. The sample clock signal SCLK is thereby synchronized with the master clock MOSC. The synchronization unit SYN, the counter unit OSCCNTR, the multiplier MULT, the count register CNTRREG and the delay unit DLY are arranged to be clocked with the master clock MOSC. Hereby, the registers may be cleared, shifted or read-out every master clock period.

The master clock MOSC may have a master clock frequency in a range of 20-2000 times the frequency of the input signal FD, such as in a range of 50-1000 times the frequency of the input signal FD, or in a range of 100-500 times the frequency of the input signal FD. The inventor considers these ranges a suitable compromise between accuracy and other performance characteristics, such as power consumption. The frequency of the input signal FD may relate to the oscillation frequency of the vibrating MEMS gyroscope. The frequency of the input signal may be in a range of 1 kHz-100 kHz, associated with a vibration MEMS gyroscope having a resonance frequency in a range of 1 kHz-100 kHz. In an example, the oscillation frequency of the vibrating MEMS gyroscope may be approximately 13 kHz and the master clock frequency may be in a range of 2-20 MHz, such as 2 MHz, 4 MHz, 8 MHz or 16 MHz.

Figure 6:
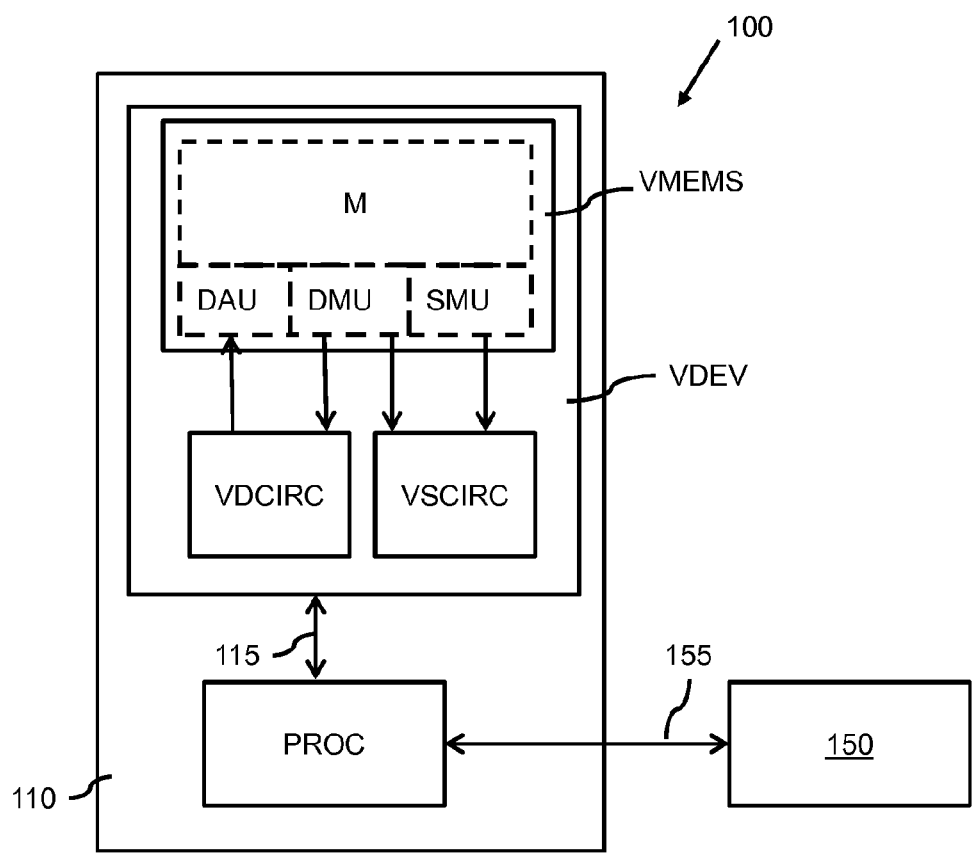
FIG. 6 schematically shows an example of an embodiment of an apparatus.

FIG. 6 schematically shows an example of an embodiment of an apparatus 100. The apparatus 100 may, for example, be a mobile communication device, a global positioning device, a game controller or a security system for e.g. a car lock.

The apparatus 100 comprises a gyroscope unit 110 and a user interface unit 150. The gyroscope unit 110 comprises a vibration gyroscope device VDEV and a control processor PROC. The user interface unit 150 is arranged to receive user input from, e.g., a key board, a mouse, another user input device, a memory device or another communication device. The user interface unit 150 is further arranged to present information to a user, e.g., via a display or audible signals. The gyroscope unit 110 may be provided as a semiconductor device. The control processor PROC is connected to the vibration gyroscope device VDEV via a gyroscope interface signal line 115 and arranged to communicate with the vibration gyroscope device VDEV via the gyroscope interface signal line 115. The control processor PROC may hereby provide the drive-mode vibration circuitry VDCIRC and the sense-mode vibration circuitry VSCIRC with the reference envelope amplitude RefAmp, the respective pre-determined in-phase phase shift fraction(s) PhI and the pre-determined quadrature phase shift fraction PhQ. The control processor PROC is connected to the user interface unit 150 via a user interface signal line 155 and arranged to communicate with the user interface unit 150 via the user interface signal line 155. In this example, the vibration gyroscope device VDEV comprises a vibration MEMS gyroscope VMEMS, a drive-mode vibration gyroscope circuitry VDCIRC and a sense-mode vibration gyroscope circuitry VSCIRC. The drive-mode vibration gyroscope circuitry VDCIRC is connected to the drive actuation unit DAU and the drive measurement unit of the VMEMS, as described in reference to FIG. 2. The sense-mode vibration gyroscope circuitry VSCIRC is connected to the drive measurement unit of the VMEMS and the sense measurement unit of the VMEMS, as described in reference to FIG. 3a or, in an alternative example, FIG. 3b, and is arranged to provide the determined measure AROT to the control processor PROC.

According to other embodiments, the vibration gyroscope device VDEV may comprise a vibration MEMS gyroscope and a vibration gyroscope circuitry comprising a drive-mode vibration gyroscope circuitry VDCIRC according to an embodiment and/or a sense-mode vibration gyroscope circuitry VSCIRC according to an embodiment.

According to other aspects, a semiconductor device comprising a digital sample clock generator SCG according to an embodiment, a vibration gyroscope circuitry comprising a drive-mode vibration gyroscope circuitry VDCIRC according to an embodiment and/or a sense-mode vibration gyroscope circuitry VSCIRC according to an embodiment, or a vibration gyroscope device VDEV according to an embodiment is provided.

Figure 7:
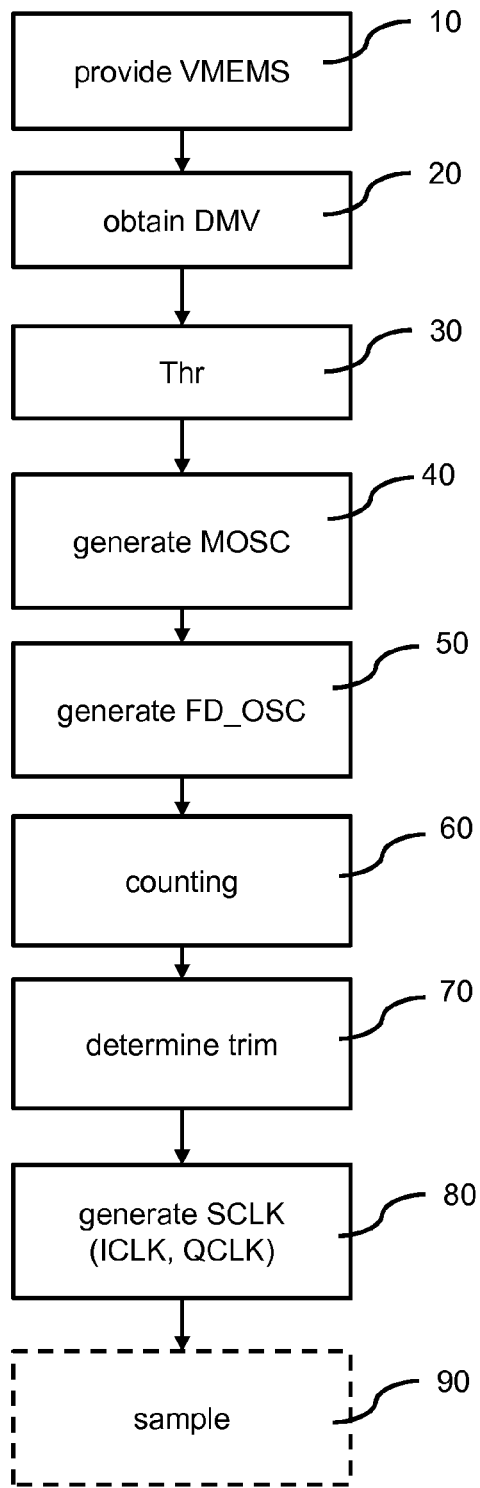
FIG. 7 schematically shows an example of an embodiment of a method of generating a sample clock signal.

FIG. 7 schematically shows an example of an embodiment of a method of generating a sample clock signal SCLK.

The method comprises providing 10 a vibrating MEMS gyroscope VMEMS and a vibration gyroscope circuitry, obtaining 20 a drive measurement voltage signal DMV indicative of a displacement of a gyroscope mass M along a drive axis x of the vibrating MEMS gyroscope VMEMS, and performing 30 a threshold detection on the drive measurement voltage signal (DMV) to obtain a digital signal FD as an input signal FD for a further sample clock generation stages 40, 50, 60, 70, 80. The further sample clock generation stages comprise generating 40 a master clock MOSC with a master clock period and generating 50 a synchronization pulse FD_OSC from detecting a start of an input signal period FD_PER of the input signal FD and, upon detecting the start, generating the synchronization pulse FD_OSC in synchronization with the master clock. The further sample clock generation stages comprise counting 60 master clock periods between subsequent synchronization pulses to obtain the number of master clock periods between subsequent synchronization pulses as a number count, determining 70 a number of trim periods from multiplying the number count with a pre-determined phase shift fraction PhPerc, and generating 80 the sample clock signal SLCK with a clock signal period SCLK_PER corresponding to the number count CNT and with a delay relative to the synchronization pulse corresponding to the number of trim periods TRM.

A method of driving a vibration MEMS gyroscope is also provided, the method comprising generating a sample clock signal SCLK as described above, while using a pre-determined in-phase phase shift fraction PhI as the pre-determined phase shift fraction PhPerc, sampling 90 the drive measurement voltage signal DMV with the in-phase sample clock ICLK to obtain envelope sample values, subtracting the envelope sample values from a pre-determined reference envelope amplitude RefAmp to obtain a gain factor g, integrating the drive measurement voltage signal DMV to obtain an integrated drive measurement voltage signal DMI, and amplifying the integrated drive measurement voltage signal DMI with the gain factor g to obtain a drive actuation voltage signal DAS and to provide the drive actuation voltage signal DAS to a drive actuation unit DAU of the vibration gyroscope VMEMS.

A method of determining a measure of an angular rotation rate using a vibration MEMS gyroscope is also provided. The method comprises generating an in-phase sample clock as described above while using a pre-determined in-phase phase shift fraction PhI as the pre-determined phase shift fraction PhPerc, obtaining a sense measurement voltage signal SMV indicative of a displacement of the gyroscope mass M along a sense axis y, the sense axis x being at a sense angle relative to the drive axis x, sampling the sense measurement voltage signal DMS with the in-phase sample clock ICLK to obtain in-phase sense sample values, and determining the measure AROT of the angular rate from at least the in-phase sense sample values.

In a further embodiment, the method further comprises generating a quadrature sample clock QCLK using a method of generating a sample clock as described above while using a quadrature phase shift fraction PhQ as the pre-determined phase shift fraction PhPerc, the quadrature sample clock having a pre-determined quadrature phase shift relative to the drive measurement voltage signal DMV, sampling the sense measurement voltage signal DMS with the quadrature sample clock QCLK to obtain quadrature sense sample values, and determining the measure AROT of the angular rate from the in-phase sense sample values and the quadrature sense sample values In an alternative further embodiment, the method of determining a measure of an angular rotation rate using a vibration MEMS gyroscope may use the digital signal FD as the quadrature sample clock instead of generating a quadrature sample clock with a pre-determined quadrature phase shift.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

As used herein, the term "bus" is used to refer to a plurality of signals or conductors which may be used to transfer one. The terms "assert" or "set" and "negate" (or "deassert" or "clear") are used herein when referring to the rendering of a signal, status bit, or similar apparatus into its logically true or logically false state, respectively. If the logically true state is a logic level one or '1', the logically false state is a logic level zero or '0'. And if the logically true state is a logic level zero or 'o', the logically false state is a logic level one or '1'.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Also, units may be shared. For example, where a mode vibration gyroscope circuitry comprises a drive-mode vibration gyroscope circuitry VDCIRC and a sense-mode vibration gyroscope circuitry VSCIRC, a single threshold detector ThrM may be shared between the drive-mode vibration gyroscope circuitry VDCIRC and the sense-mode vibration gyroscope circuitry VSCIRC. Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A digital sample clock generator for generating a sample clock signal from an input signal derived from a drive measurement voltage signal of a vibrating MEMS gyroscope, the sample clock generator comprising:
   an oscillator arranged to generate a master clock with a master clock period;
   a synchronization unit arranged to detect a start of an input signal period of the input signal and to, upon detecting the start, generate a synchronization pulse in synchronization with the master clock;
   a counter unit arrange to count master clock periods between subsequent synchronization pulses to obtain the number of master clock between subsequent synchronization pulses as a number count;
   a multiplier arranged to multiply the number count with a pre-determined phase shift fraction to obtain a number of trim periods; and
   a delay unit arranged to generate the sample clock signal with a clock signal period corresponding to the number count and with a delay relative to the synchronization pulse corresponding to the number of trim periods.

2. A digital sample clock generator according to claim 1, the synchronization unit, the counter unit, the multiplier and the delay unit arranged to be clocked with the master clock.

3. A digital sample clock generator according to claim 2, further comprising a count register arranged to store the number count, the count register comprising a latch input for receiving the synchronization pulse for latching the number count as stored in the count register to the multiplier upon receiving the synchronization pulse.

4. A digital sample clock generator according to claim 3, the counter unit comprising a reset input for receiving the synchronization pulse, the counter unit being arranged to reset a counter upon receiving the synchronization pulse, to increment the counter at each master clock period and to store the counter in the count register.

5. A digital sample clock generator according to claim 1, the multiplier being arranged to receive the pre-determined phase shift fraction from a user.

6. A digital sample clock generator according to claim 1, the master clock having a master clock frequency in a range of 50-1000 times the frequency of the input signal.

7. A digital sample clock generator according to claim 6, the frequency of the input signal being in a range of 1 kHz-100 kHz.

8. A vibration gyroscope circuitry comprising a first capacitance-to-voltage unit, a threshold detector, and a digital sample clock generator according to claim 1, wherein
the first capacitance-to-voltage unit being arranged to provide a drive measurement voltage signal indicative of a displacement of a gyroscope mass along a drive axis of a vibrating MEMS gyroscope;
the threshold detector arranged to perform a threshold detection on the drive measurement voltage signal to obtain a digital signal; and
the digital sample clock generator arranged to receive the digital signal as the input signal and to generate the sample clock in dependence on a pre-determined in-phase phase shift fraction as an in-phase sample clock so as to obtain the in-phase sample clock in-phase with the drive measurement voltage signal.

9. A drive-mode vibration gyroscope circuitry comprising a vibration gyroscope circuitry according to claim 8, a drive measurement signal sampler, a subtractor, an integrator and a variable gain amplifier, wherein
the drive measurement signal sampler being arranged to sample the drive measurement voltage signal with the in-phase sample clock to obtain envelope sample values;
the subtractor being arranged to subtract the envelope sample values from a pre-determined reference envelope amplitude to obtain a gain factor;
the integrator being arranged to integrate the drive measurement voltage signal to obtain an integrated drive measurement voltage signal; and
the variable gain amplifier being arranged to amplify the integrated drive measurement voltage signal with the gain factor to obtain a drive actuation voltage signal and to provide the a drive actuation voltage signal to a drive actuation unit of the vibration gyroscope.

10. A drive-mode vibration gyroscope circuitry according to claim 9, the subtractor being arranged to receive the pre-determined reference envelope amplitude from a user.

11. A sense-mode vibration gyroscope circuitry comprising a vibration gyroscope circuitry according to claim 8, a first sampler, a second capacitance-to-voltage unit and a sample processor, wherein
the second capacitance-to-voltage unit being arranged to provide a sense measurement voltage signal indicative of a displacement of the gyroscope mass along a sense axis, the sense axis being at a sense angle relative to the drive axis;
the first sampler being arranged to sample the sense measurement voltage signal with the in-phase sample clock to obtain in-phase sense sample values; and
a sample processor arranged to receive and process at least the in-phase sense sample values, the sample processor arranged to determine a measure of an angular rate in dependence on the in-phase sense sample values.

12. A sense-mode vibration gyroscope circuitry according to claim 11, the sense-mode vibration gyroscope circuitry further comprising:
a second sampler, wherein
the second sampler being arranged to receive the digital signal as a quadrature sample clock and to sample the sense measurement voltage signal with the quadrature sample clock to obtain quadrature sense sample values, and
the sample processor arranged to receive and process the in-phase sense sample values and the quadrature sense sample values, the sample processor comprising a sample combiner arranged to determine the measure of an angular rate in dependence on the in-phase sense sample values and the quadrature sense sample values.

13. A sense-mode vibration gyroscope circuitry according to claim 11, the sense-mode vibration gyroscope circuitry (VSCIRC) further comprising:
a further digital sample clock generator and a second sampler, wherein
the further digital sample clock generator arranged to receive the digital signal as the input signal and to generate the sample clock as an quadrature sample clock in dependence on a pre-determined quadrature phase shift fraction, the quadrature sample clock having a pre-determined quadrature phase shift relative to the drive measurement voltage signal, and
the second sampler being arranged to sample the sense measurement voltage signal with the quadrature sample clock to obtain quadrature sense sample values, and
the sample processor arranged to receive and process the in-phase sense sample values and the quadrature sense sample values, the sample processor comprising a sample combiner arranged to determine a measure of an angular rate in dependence on the in-phase sense sample values and the quadrature sense sample values.

14. A vibration gyroscope device comprising a vibration MEMS gyroscope and a vibration gyroscope circuitry comprising a drive-mode vibration gyroscope circuitry according to claim 9.

15. A vibration gyroscope device according to claim 14, the vibration MEMS gyroscope having a resonance frequency in a range of 1 kHz-100 kHz.

16. A semiconductor device comprising a digital sample clock generator according to claim 1.

17. A method of generating a sample clock signal from an input signal, the method comprising:
generating a master clock with a master clock period,
generating a synchronization pulse from detecting a start of an input signal period of the input signal and, upon detecting the start, generating the synchronization pulse in synchronization with the master clock, counting master clock periods between subsequent synchronization pulses to obtain the number of master clock periods between subsequent synchronization pulses as a number count, determining a number of trim periods from multiplying the number count with a pre-determined phase shift fraction, and generating the sample clock signal with a clock signal period corresponding to the number count and with a delay relative to the synchronization pulse corresponding to the number of trim periods.

18. The method according to claim 17, further comprising:

obtaining a drive measurement voltage signal indicative of a displacement of a gyroscope mass along a drive axis of a vibrating MEMS gyroscope; and performing a threshold detection on the drive measurement voltage signal to obtain a digital signal as the input signal.

19. A method of driving a vibration MEMS gyroscope, the method comprising:

generating a sample clock with a method as claimed in claim 18 using a pre-determined in-phase phase shift fraction as the pre-determined phase shift fraction;

sampling the drive measurement voltage signal with the in-phase sample clock to obtain envelope sample values;

subtracting the envelope sample values from a pre-determined reference envelope amplitude to obtain a gain factor;

integrating the drive measurement voltage signal to obtain an integrated drive measurement voltage signal; and amplifying the integrated drive measurement voltage signal with the gain factor to obtain a drive actuation voltage signal and to provide the drive actuation voltage signal to a drive actuation unit of the vibration gyroscope.

20. A method of determining a measure of an angular rotation rate using a vibration MEMS gyroscope, the method comprising:

generating an in-phase sample clock using a method as claimed in claim 18 using a pre-determined in-phase phase shift fraction as the pre-determined phase shift fraction;

obtaining a sense measurement voltage signal indicative of a displacement of the gyroscope mass along a sense axis, the sense axis being at a sense angle relative to the drive axis;

sampling the sense measurement voltage signal with the in-phase sample clock to obtain in-phase sense sample values; and determining the measure of the angular rate from at least the in-phase sense sample values.

* * * * *